US00RE36528E

United States Patent [19]

Roustaei

[11] E Patent Number: Re. 36,528

[45] Reissued Date of Patent: Jan. 25, 2000

[54] OPTICAL SCANNING HEAD

[75] Inventor: Alexander R. Roustaei, La Jolla, Calif.

[73] Assignee: Symbol Technologies, Inc., Holtsville, N.Y.

[21] Appl. No.: 08/410,509

[22] Filed: Mar. 24, 1995

Related U.S. Patent Documents

Reissue of:

[64] Patent No.: 5,291,009
Issued: Mar. 1, 1994
Appl. No.: 07/843,266
Filed: Feb. 27, 1992

[51] Int. Cl.[7] ..... G06K 7/10

[52] U.S. Cl. ..... 235/472.01; 235/455; 235/462.41; 235/462.42

[58] Field of Search ..... 235/455, 472, 235/462, 466, 462.41, 462.42; 250/568, 227

[56] References Cited

U.S. PATENT DOCUMENTS

| | | | |
|---|---|---|---|
| 3,819,938 | 6/1974 | Kornrumpf et al. | 250/222 |
| 3,876,900 | 4/1975 | Amatsuka et al. | 313/510 |
| 4,115,703 | 9/1978 | Dobras | 250/568 |
| 4,306,147 | 12/1981 | Fukuyama et al. | 250/221 |
| 4,315,245 | 2/1982 | Nakahara | 235/472 |
| 4,488,679 | 12/1984 | Bockholt | 235/472 |
| 4,542,528 | 9/1985 | Sanner et al. | 382/62 |
| 4,570,057 | 2/1986 | Chadima, Jr. et al. | 235/472 |
| 4,578,571 | 3/1986 | Williams | 235/472 |
| 4,647,766 | 3/1987 | Dimur et al. | 250/227 |
| 4,804,949 | 2/1989 | Faulkerson | 340/710 |
| 4,818,847 | 4/1989 | Hara et al. | 235/455 |
| 4,841,132 | 6/1989 | Kajitani et al. | 235/472 |
| 4,900,907 | 2/1990 | Matusima et al. | 235/472 |
| 5,001,330 | 3/1991 | Koch | 235/494 |
| 5,010,241 | 4/1991 | Butterworth | 235/462 |
| 5,032,960 | 7/1991 | Katoh | 235/472 X |
| 5,073,954 | 12/1991 | Van Tyne et al. | 382/18 |
| 5,135,160 | 8/1992 | Tasaki | 235/462 |
| 5,196,684 | 3/1993 | Lum et al. | 235/462 |
| 5,291,009 | 3/1994 | Roustaei | 235/472 |
| 5,349,172 | 9/1994 | Roustaei | 235/472 |
| 5,354,977 | 10/1994 | Roustaei | 235/472 |

OTHER PUBLICATIONS

"CCD Bar Code Scanner;" ZB–1000/2000Plus Series, Zebex Industries, Inc., 1992 Zebex Catalog No. 920802.

"CCD Bar Code Handy Scanner Model BHS–6000 Series;" Nippondenso Co., Ltd., Mar. 1992 brochure.

"Get a Head with Denso's Reading Edge Technology;" ID Systems, Apr. 1987, vol. 7, No. 3.

"Information Encoding with Two–Dimensional Bar Codes," Theo Pavlidis, et al., Computer, vol. 25, No. 6, Jun., 1992, pp. 18–28.

*Primary Examiner*—Harold I. Pitts
*Attorney, Agent, or Firm*—Morgan & Finnegan, L.L.P.

[57] ABSTRACT

The [ornamental] design for a bar code Scanner using the Light Emitting Diode (LED), Optical Scanner assembly and Charge-Coupled Devices (CCD) capable of reading the barcode symbols at the variable distance, as shown and described. The optical passive elements for increasing the depth of field and method of fabricating the scanning head by mass-production techniques are also disclosed.

22 Claims, 8 Drawing Sheets

OPTICAL SCANNING HEAD

Matter enclosed in heavy brackets [ ] appears in the original patent but forms no part of this reissue specification; matter printed in italics indicates the additions made by reissue.

FIELD OF THE INVENTION

The present invention generally relates to scanning system for reading and/or analyzing bar code symbols, and more particularly, to a light-weight, easy to integrate, single windowed, bar code scanning head supportable entirely by a user, system integrator and manufacturer (who wishes to integrate the scanning head in their own devices as bar code reading device) throughout the reading of the symbols.

BACKGROUND OF THE INVENTION

Many industries, including the assembly processing, grocery and food processing industry, have designated their products with a bar code symbol consisting of a series of lines and spaces of varying widths. Different bar code readers and laser scanning systems have been developed to decode the symbol pattern to a multiple digit representation for inventory, production-tracking and check-out purposes.

Modern miniature laser scanners using the laser diode, have recently been proposed to provide a portable and integrable laser scanning head for reading the bar code symbols at the variable distance. Other bar code scanners (called CCD bar code scanner) using the Light Emitting Diodes (LEDs) source and Charge Coupled Devices (CCD) have been developed to provide the same facilities at a reading distance of zero (contact) up to one and half inches away and for a bar code width no longer than the window or housing width. The actual CCD bar code scanner does not provide the comfort of the laser scanner which allows to read the bar code symbols at the variable distance and greater than the window or housing width.

SUMMARY OF THE INVENTION

The invention resides, briefly stated, in a scanning head of a scanning system for reading bar code symbols, at the variable distance, and greater than the window or housing width, using the LEDs source, optical passive assembly and charge coupled devices (CCD).

The Scanning Head module is equipped with a series of a readily-visible Light Emitting Diodes (LEDs) light source and a release/start-up mechanism/input, aiming light arrangement through a window for changing the reading distance and/or the beam line size of an outgoing LEDs beam scanned across symbols to be read by the Scanning Head.

The Scanning head for reading barcode symbols includes one window mounted on the front region of the head and through which either the incident beam going to the symbol and/or the reflected beam returning from the symbol, pass the window through and exteriorly of, and past, the front and intermediate internal body region of the scanner (head). Optical passive elements for increasing the dept of field will be in the front of the CCD.

Using different optical assembly lenses to perform a function to read far-out and close-in (in contact) symbols as well as an interchangeable component design and an integral window construction for the head also are disclosed.

The Scanning Head Module includes five regions:

1—front region

2—rear region

3—intermediate region

4—top region

5—bottom region

The scanning head has a predetermined height defined by a pair of opposing printed board circuits spaced vertically apart of each other.

The scanning head includes:

a light source means, e.g. Light Emitting Diodes (LEDs), mounted in different direction to either side of the device within the scanning head, for generating an incident light beam toward a reference plane located exteriorly of the scanning module in the front region and therefore toward a bar code symbol located in the reference plane.

an optic module means, e.g. a dark room including a lens support consisting of at least two lenses, is mounted on the intermediate region, between the rear of the light source LEDs and front of the sensor CCD, and is operative for directing the reflected light along a light path away from the reference plane and back toward the housing.

a sensor means e.g. Charge Coupled Devices (CCD), is mounted in the rear region and behind of the optic module, for detecting the light intensity in the reflected beam over a field of view across the bar code symbol, and for generating an electrical analog signal indicative of the detected light intensity. Signal convertor processing means e.g. analog filter and analog to digital conversion processing circuitry, is also mounted within the scanning head, for noise elimination and digitalizing the analog signal to generate therefrom data descriptive of the bar code symbol.

In accordance with this invention, window means is mounted on the scanning module or integration housing, and a broad aspect of this invention, the source light-transmissive window is mounted at the front region of the scanning head and in the front of the source light. The window is filtering and positioning the light path of the incident beam. The reflected beam travels exteriorly of and pass through the same window, past the front and intermediate region through the lenses support and the dark room.

Due to the exterior transmission of the incident beam, the field and the depth of view are substantially independent of the width of the window or housing, because of the LEDs position, lenses and filter assembly mounted in the front of the dark room, between the top and the bottom region. Put another way, the angular distance and depth of field are considerably improved.

BRIEF DESCRIPTION OF THE DRAWINGS

The invention will now be described, by way of example, with reference to the accompanying drawings, in which.

DETAILED DESCRIPTION OF THE PREFERRED EMBODIMENT

Figure 1:
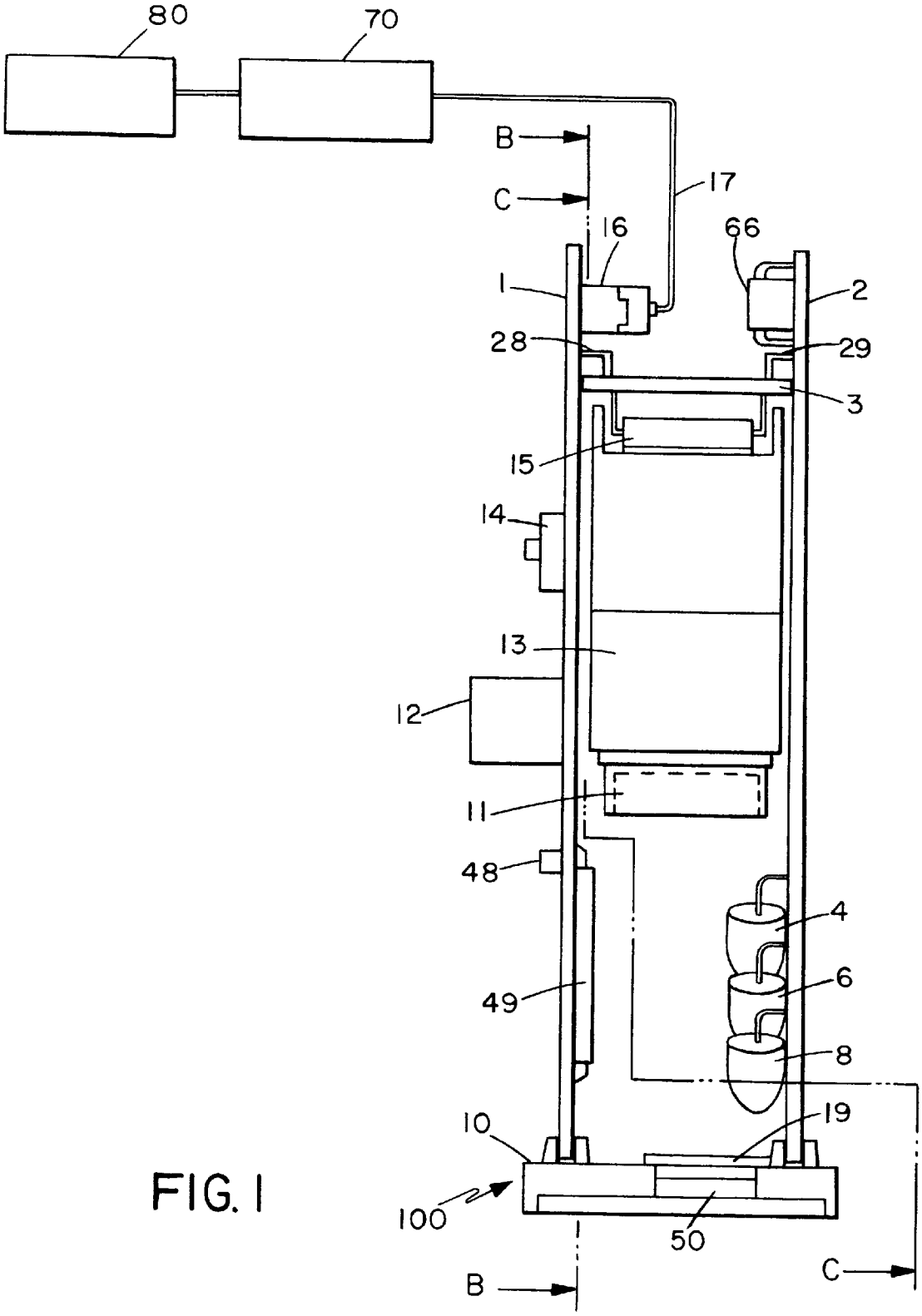
FIG. 1 is a side sectional view of a scanning head in accordance with this invention.

Referring now to FIGS. 1–7 of the drawings, reference numeral 100 generally identifies a scanning head, easy to use and to integrate in an enclosure or other products for reading, scanning and/or analyzing bar code symbols throughout thereof. The scanning head way include the decoder module which decodes a multiple-digit representation of the bar code symbols such as UPC, EAN, JAN, Code 39, Code 2/5I, Code 2/5, Code 128, Codabar, Plessey, etc.

Referring to FIG. 1, the scanning head 100 includes generally a window portion 10 holding the printed board portion 1 and portion 2. The printed board portion 3 is mounted between portion 1 and 2, in the rear region of the scanning head 100. The portion 1 and 2 are spaced apart of each other by a predetermined height dimension.

A light source means, i.e., six LEDs 4–9. Three LEDs are soldered in different direction, on each side of the surface of portion 2, along the longitudinal axis and are operative for generating, each one, a fraction of the incident light beam.

An optic module means, i.e., three lenses, are mounted inside of a lens support portion 11. The portion 11 is mounted on the dark room portion 13, which is located in the front area of the CCD portion 15, located in the rear region, as shows in FIGS. 1 and 2. A bar code symbol to be read is located in the vicinity of the reference plane, that is, anywhere within the depth of focus of the incident beam as described below, and the light reflected from the symbol constitutes a reflected beam which is reflected along a light path away from the reference plane and back toward the scanning head.

Figure 4:
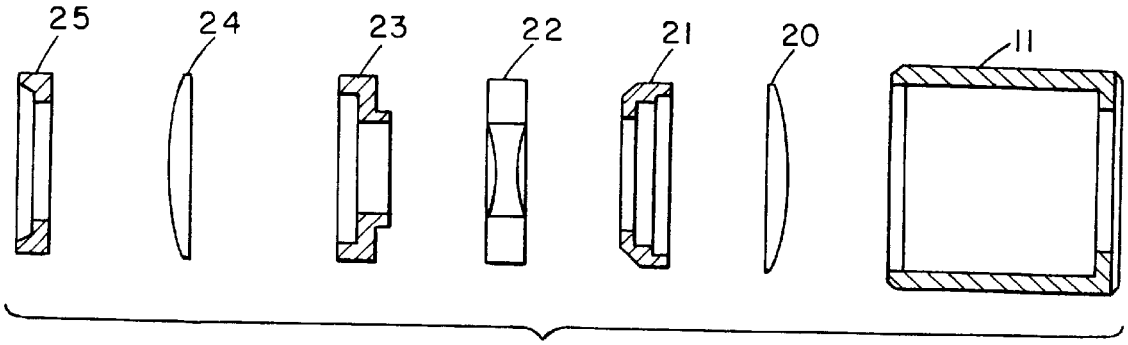
FIG. 4 is a top plan sectional view of the optical train.
Figure 5:
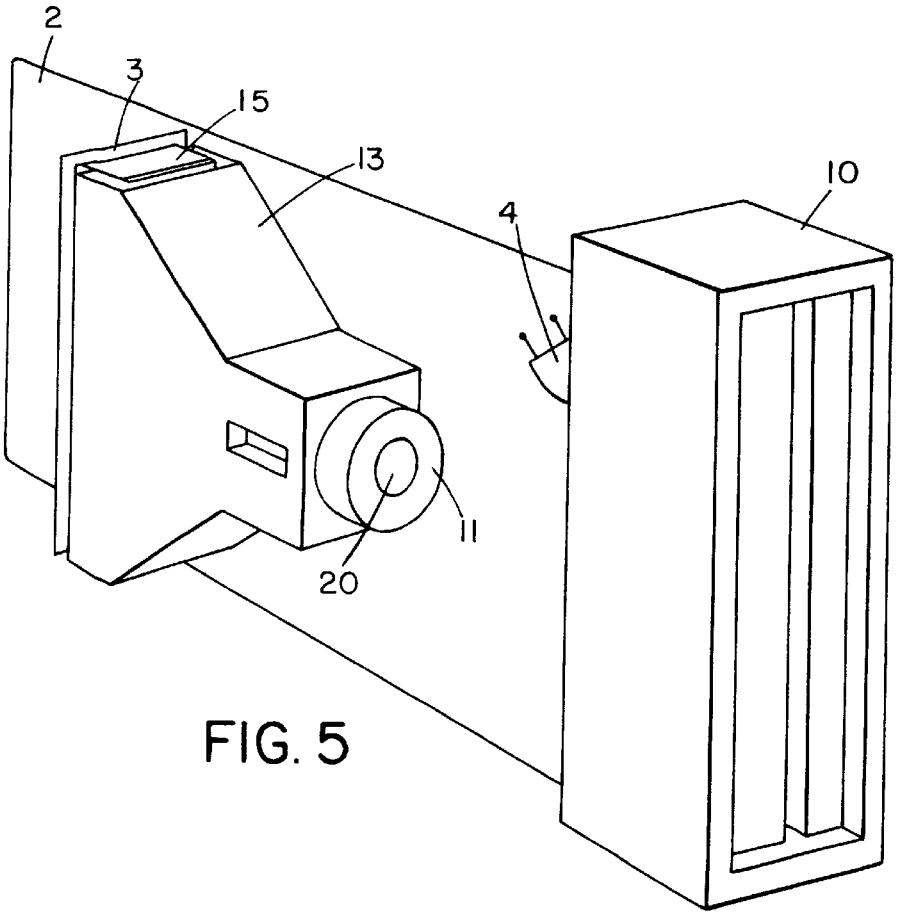
FIG. 5 is a partially front view of the FIG. 1, showing the front window.

As best shown in FIG. 4 the following portion are mounted in a cylindrical lenses support 11:

- a plano-convex lens 20 which is followed with an optic filter portion 21;
- a bi-concave lens 22 which is followed with an diffuser portion 23;
- a plano-convex lens 24 which may be followed with a lens cap 25 or not. If the lens cap portion 25 is not used, the lens 24 may be fixed by using the glue or any other fixturing method.

The disposition of the LEDs makes that the output LED's beam is automatically optically aligned with the center of the optic support 11.

The dark room 13 is a one-piece light-weight part machined or preferably molded by inexpensive mass-production techniques of a dimensionally stable material.

The beam generated by emitted from the LEDs 4–9 passes through the window portion 10. The line size remains approximatively constant throughout the depth of focus at either side of the tolerance plane, because of the window's aperture, portion 10.

The scanning means is preferably a high-speed scanner by:

modulating the LED's light, or modulating the CCD's scanning transfer pulses.

Although only a single narrow line light is shown in the drawing for illumination from the LED's beam across the symbol along a predetermination direction (X-axis scanning) lengthwise thereof, it is understood that the beam generated by the LEDs for illumination of the symbol along a transverse direction (Y-axis scanning) which is substantially orthogonal to the predeterminated direction is automatically generated.

Figure 2:
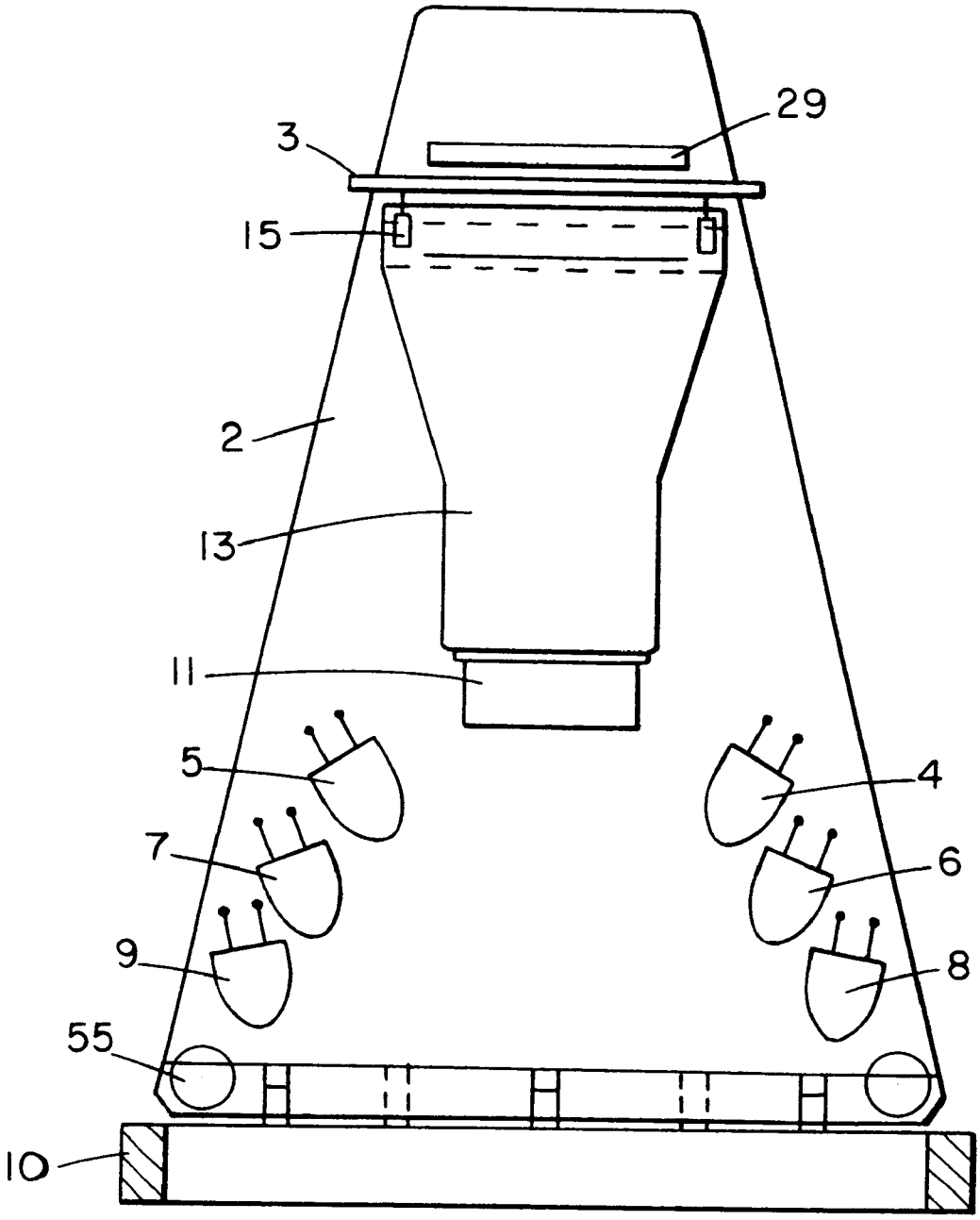
FIG. 2 is a partially broken-away, top sectional view as taken along line B—B of FIG. 1.
Figure 3:
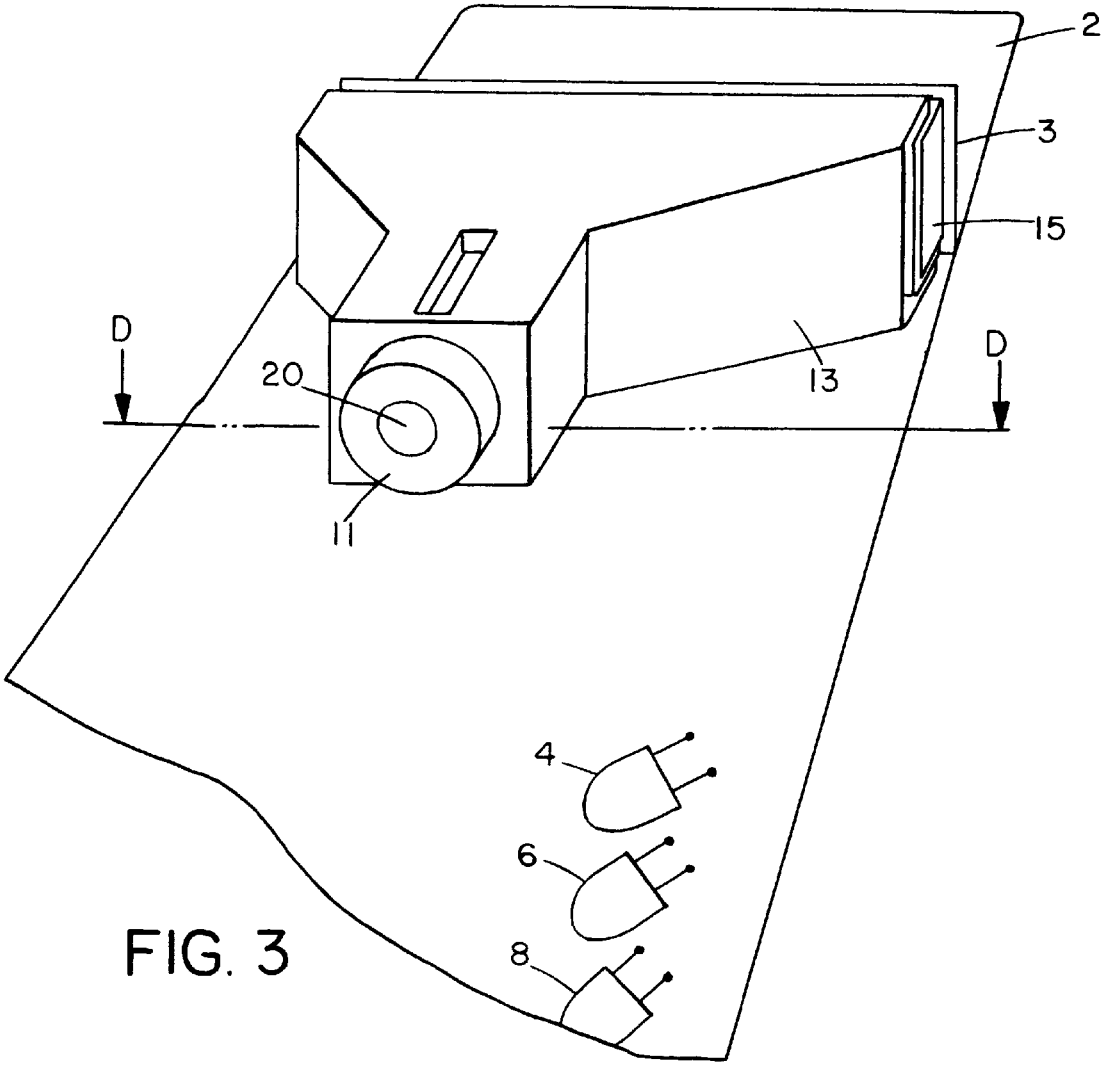
FIGS. 3 and 3(b) are front perspective view as taken along line C—C of FIG. 1, showing the dark room and the optical lenses support.
Figure 3B:
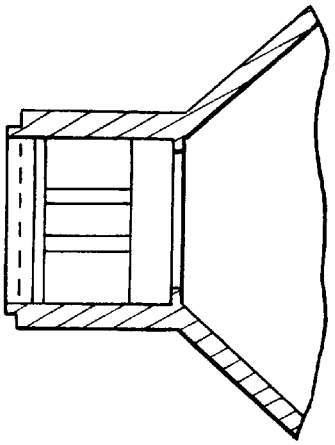
Figure 7:
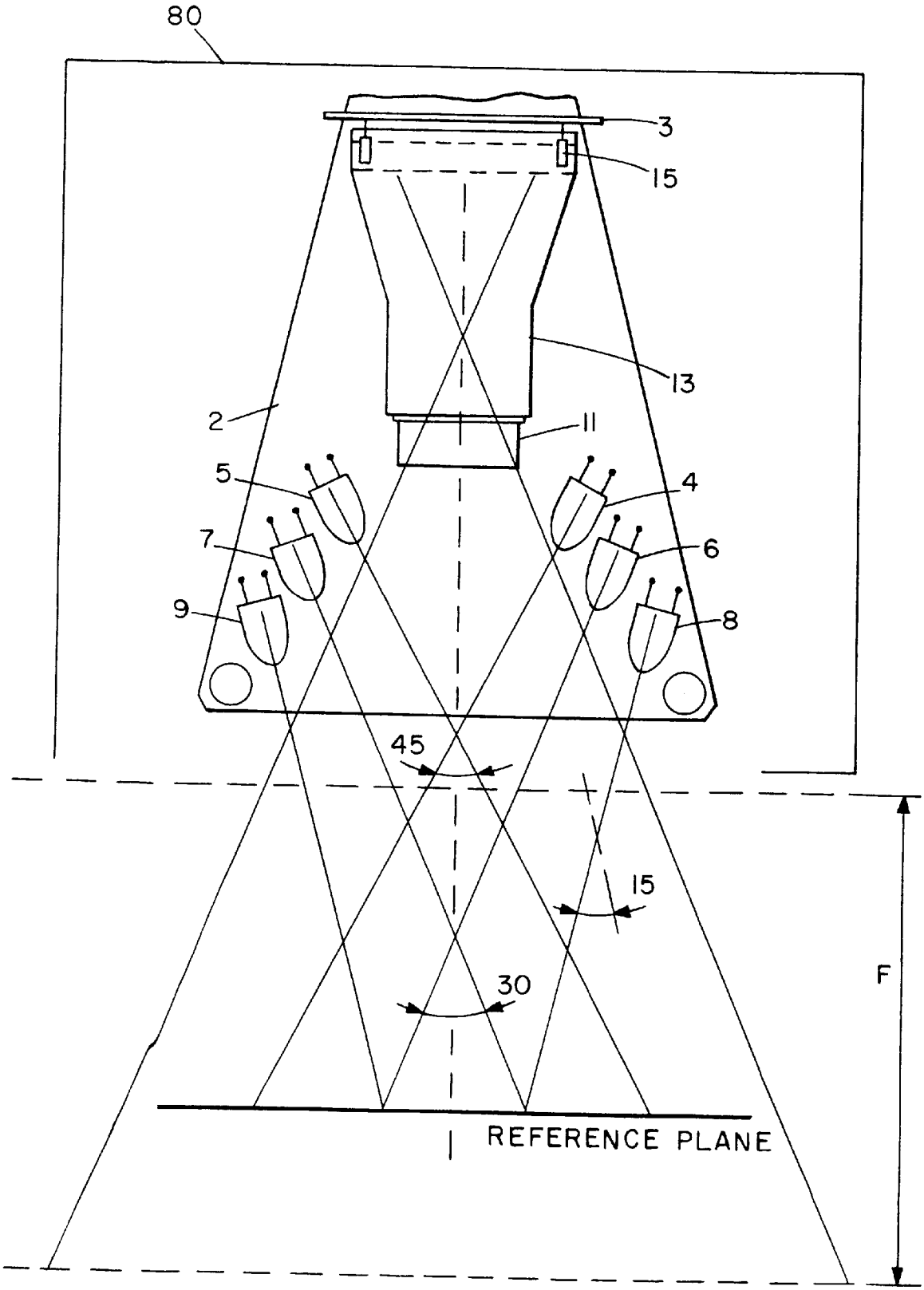
FIG 7 is a top plan schematic view of the scanning head of FIG. 1.

Referring to the FIGS. 1, 2 and 7, the light path of the incident beam at the front region of the head will generate a line incident beam through an angular distance A over a field of view across the bar code symbol located in the vicinity of the reference plane. A LED-light-transmissive window 19 may be mounted on the front region and inside of the window 10, or behind the opening 50, formed therein a front closed scanning head. It is noted that the width dimension of the light-transmissive window 19 represents a limiting factor for the width of the incident beam. Hence, as a rule, the LEDs 4–9 are mounted as close as possible to the light-transmissive window to optimize the field of view and the incident's beam power.

As shown in FIG. 7, the field of view of the incident beam is substantially independent of the width of the printed circuit board 1, 2 or more generally of the integrated body or housing, in fact, the field of view, i.e., the transverse beam dimension, of the incident beam will be larger than the width of the window 10. This is, of course, due to the fact that the LED's incident beam has been transmitted outside of the front region of the scanning head, in different directions from each side of the device, within the scanning head. In this case the width of the LED's incident beam is four inches at a distance of one inch from the window 10 and increase to 5 inches at a distance of two and half inches from the window 10. Hence, the exterior transmission of the LED's incident beam and reading from a distance of five to nine inches permits the head of the present invention to have a distance bar code CCD scanner reader.

A LED light-transmissive window 50 can be mounted on the front region. The sensor CCD means 15 is operative for detecting the intensity of the light in the reflected beam coming from the symbol over a field of view across the same, throughout the lens support 11 and the dark room 13, and generating in electrical analog signal indicative of the detected light intensity. In order to improve and increase the zone of coverage of the sensor means, an optic filter 21 and an optic diffuser 24, are placed inside of the cylindrical lens support 11 and respectively on each side of the bi-concave lens 22.

The lenses support 11, throughout the dark room, positions the light path of the reflected beam to the sensor means CCD reference numeral 15.

All other various electrical sub-circuits diagrammatically represented by reference numerals 12, 14, 47, 48, 49 are provided on the board 1. A printed circuit board 3 is mounted within the printed circuit boards 1 and 2, and some various component and sub-circuits necessary for the sensor CCD 15 are provided on the board 3. Signal convertor processing means board 3 is operative to provide the analog signal generated by the sensor CCD 15 to an analog-digital convertor to generate therefrom data descriptive of the barcode symbol. The LEDs 4–9 and other various electrical sub-circuits related with the LED's scanning control are mounted on the board 2. The decoder chip may be mounted on board 1 or 2.

The electrical power is supplied to the CCD means 15, by the appropriate DC-DC convertor mounted aboard the printed board portion 1 or 2. The power supply component is from 5 volts DC to 14 volts DC.

Figure 8A:
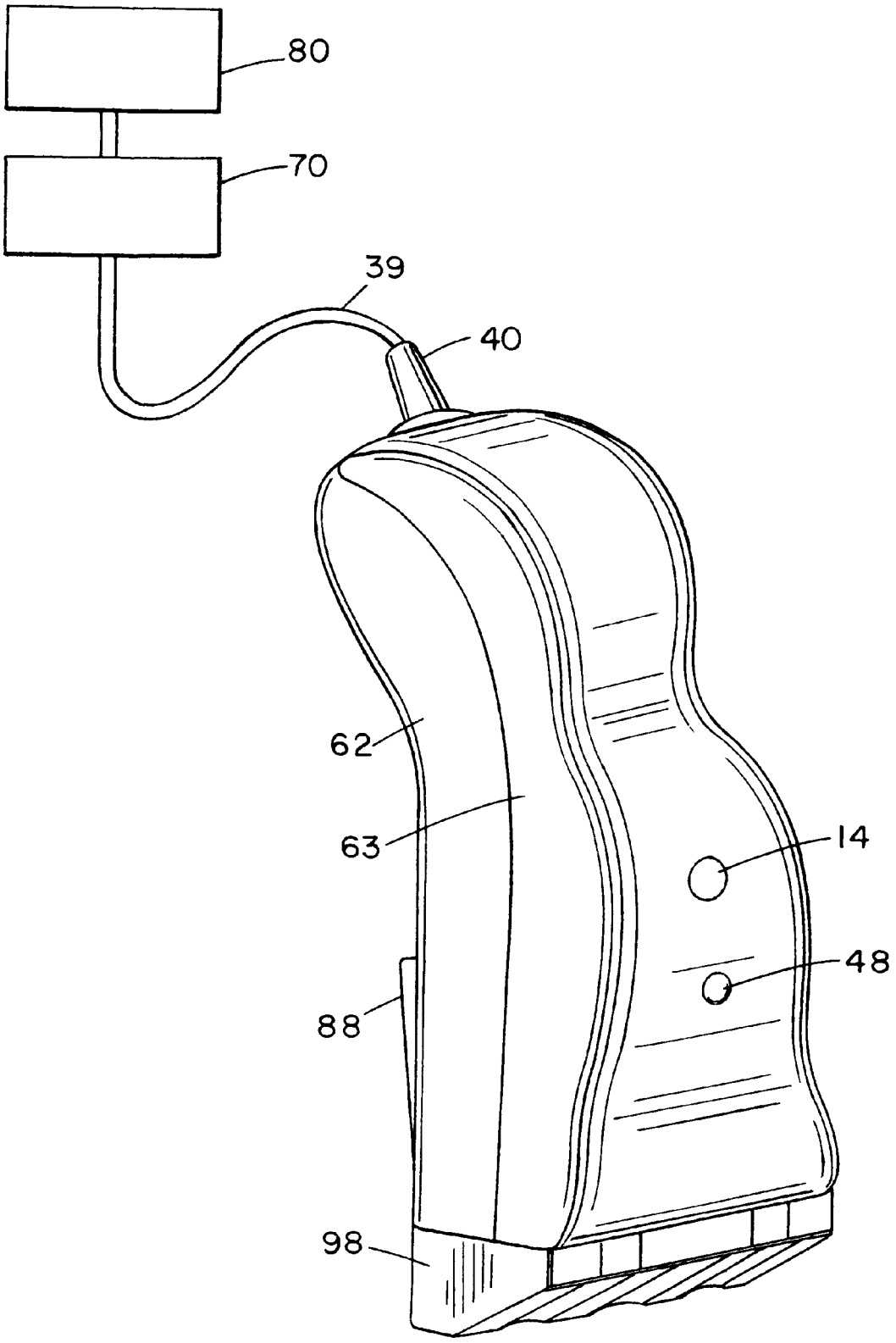
FIG. 8A is a perspective of an example of integration of the scanning head of FIG. 1, by integration of the scanning head in a housing, made in two parts (half gun-shaped or flat form) and diagrammatically shows the interconnection of the scanning head to the remainder of the system.
Figure 8B:
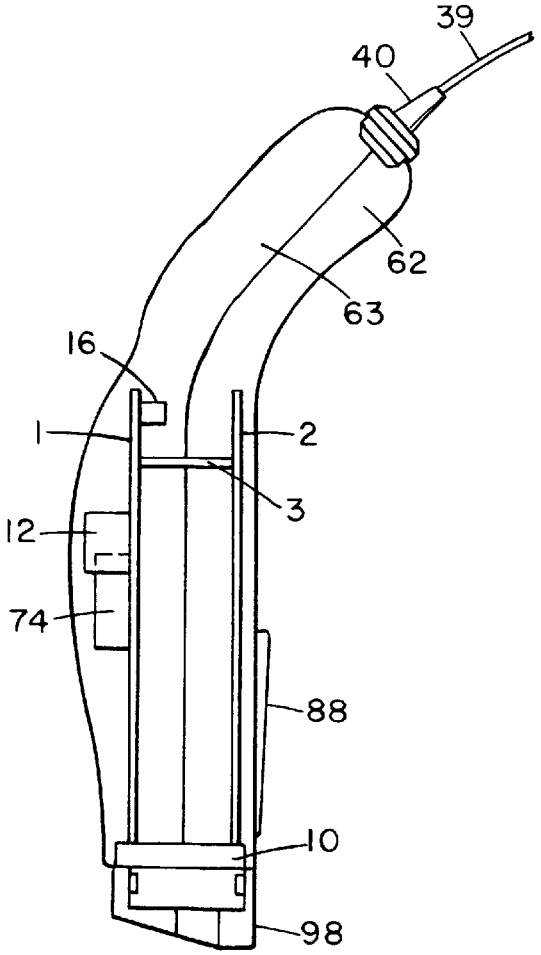
FIG. 8B is a side sectional view of an example of integration of the scanning head of FIG. 1.
Figure 8C:
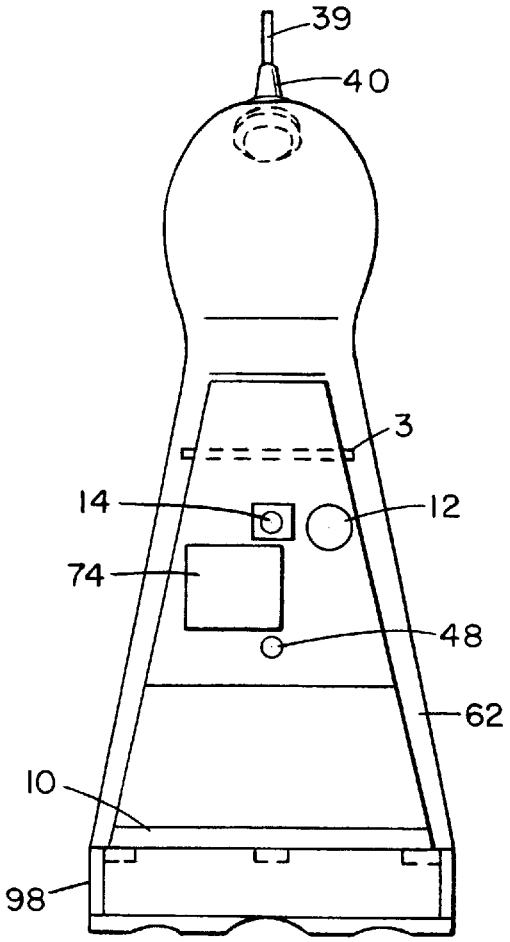
FIG. 8C is a top sectional view of an example of integration of the scanning head of FIG. 1.

A coil-type cable 39 (see FIG. 8C), or a serial in line connector 16 (see FIG. 1) may connect the scanning head 100 to the remainder of the scanning system, which includes a battery-powered decoder wedge means, e.g. the bar code decoder and the appropriate host system interfaces module 70 and a host system and/or computer 80.

The cable 17 or 39 includes a plurality of conductive wires which will carry the power voltage from the module 70 to the scanning head 100, and all other different control and communication signals from/to the scanning head 100.

The electrical connections between the connector 28, 29 and the various components in the scanning head have been omitted from the drawings for the sake of clarity.

The decoder module 70 may be inside or outside of the scanning head 100 and will process the digitalized signal generated in the scanning head, and will calculate the desired data, e.g. the multiple digit representation or code of the bar code symbol, in accordance with an algorithm contained in a software program. The decoder module 70 includes a RAM for temporary data storage, an EPROM or PAL for holding the control program and a microprocessor which controls the RAM and EPROM or PAL. The decoder module will also include circuitry for controlling the scanning head and the communication circuitry for communication with different function on the scanning head and/or with the host system or host computer 80, such as a hand held terminal, data screen, PC/PS or large data base, and provides information for the decoded symbol.

A release/start-up mechanism/input 14 is mounted on the top, intermediate region of the portion 1. By applying a zero volt on 14, the input is operative to turn the microprocessor in the decoder module on. Upon release of this input, the microprocessor will turn off after a programmable timeout, if any bar code has not be detected. This function can also be realized by using the control line through the connector 16, either a switch button or keyboard from the host system.

A visual indicator (lamp) 48 output is also mounted on the circuit board 1. This lamp indicates to the operator or to the user when a successful decode has been obtained. When a successful decode is accomplished a programmable beep indicator 12 may indicate to the operator a beep signal.

The operation of the scanning system is self-evident from the foregoing, but by way of brief review, the scanning head is integrated in the other devices or if it is in a half gun-shaped housing, it will be grasped by its handle portion (see FIG. 8A), and its barrel is aimed at the bar code symbol to be read. It is understood that the symbol can be located anywhere in the depth of field at either side of the reference plane. The movement of the scanning head from one symbol to the next is facilitated by the low weight of the scanning head if it is integrated on a handy device.

Figure 6:
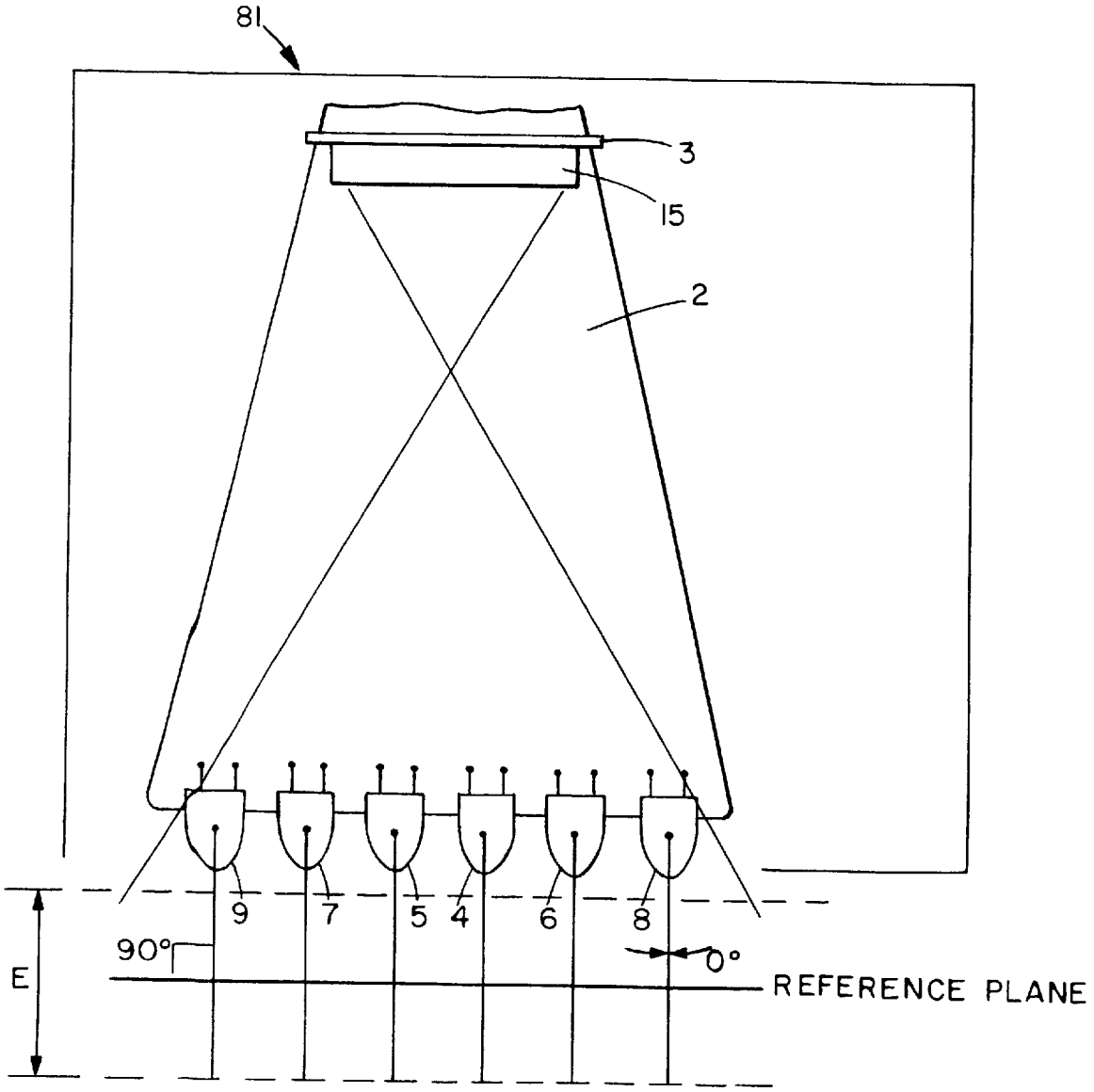
FIG. 6 is a top plan schematic view of a prior art CCD bar code scanner reading from zero (contact) up to one and half inches.

To facilitate the explanation of how the scanning head components disposition's of this invention allows to read from the distance, the schematic views of FIGS. 6 and 7 have been provided.

FIG. 6 shows a CCD scanner body portion or barrel 81 having a series of LED light means LEDs 4–9 (a series of six to eight LEDs is usually used to obtain a LED beam, because of the limited surface low power illumination of one LED), providing a perpendicular light, to generate the incident beam, from the outside of the scanning head's window 10. The reflected beam passes through the front window 10 to be detected by the sensor means CCD numeral 15, also described above. The reference plane has to be close (from zero or contact, up to one and half inches) to the front of the barrel 81, allowing the sensor CCD means 15 to have the optimal sensitivity to the reflected beam.

FIG. 7 needs no detailed description, except to repeat that the LED beam source LEDs 4–9 has its window 10 located in the front region of the scanning head, behind which each pair of LEDs is mounted in different directions to either side of the device and provides a scan angle generating a portion of the incident beam, e.g.:

the LEDs 4–5 operative to generate the extreme corner side of the incident beam through an angle A=45°;

the LEDs 6–7 operative to generate the corner side of the incident beam through an angle B=30°;

the LEDs 8–9 operative to generate the middle part of the incident beam through an angle C=15°.

The result of this smart disposition is a uniform visible incident beam (660 nm) at a very low cost, comparing to the laser diode's cost.

For the light sensor effectiveness, the closer the front region is to the reference plane, the more sensitive will be the detection by the sensor 15.

In operation, because of the limited power illumination of the LEDs, the user can aim the scanning head at a symbol located, anywhere from zero (contact) to 6" away from the front of the barrel 80.

It is understood that in this invention there is any sweeping light source to generate the incident beam. The incident beam is generated by fraction illumination issued by the LEDs means references numeral 4–9.

In accordance with the invention, the housing need only be large enough to accommodate the components mounted on portion 1, 3, and/or 2. The scanning head module may be used in different applications (each scan width requirement may be varied from one to the next) without making a change in the barrel. By mounting the scanning head means close or away to the rear of window 10, in which case the field of view of the incident beam is changed.

The Scanning head module is mountable in flat or half gun-shaped housing, hand-held heads or any other fixed or portable device and may be protected from damage due to external shock by shock mounts.

What is claimed as new and desired to be protected by letters patent is set forth in the appended claims.

I claim:

1. A device for scanning and decoding information encoded in an optical code, said device comprising:

a printed circuit board having a front, a center, and a rear with a longitudinal centerline bisecting said printed circuit board into a left side and a right side;

a plurality of LEDs disposed on said printed circuit board near said front for projecting light outward from said front, a first portion of said plurality of LEDs disposed on said left side, each LED of said first portion being directed to emit light at a non-zero angle [so that its light intersects] *with respect to* said longitudinal centerline [at an angle different from other LEDs of said first portion], and a second portion disposed on said right side, each LED of said second portion being directed to emit light at a non-zero angle[, so that its light intersects] *with respect to* said centerline [at an angle different from other LEDs of said second portion] so that a fan of light is emitted which becomes increasingly broader at greater distances from said plurality of LEDs;

an optic module disposed at said center of said printed circuit board for filtering reflected light which is reflected from the optical code and for focusing said reflected light at a focal plane;

a CCD detector disposed at said rear of said printed circuit board substantially at said focal plane, for receiving said reflected light and generating an electrical signal in response thereto;

a conversion means for converting said electrical signal into a digital signal corresponding to said [bar] *optical* code; and a voltage source for providing a driving voltage to said plurality of LEDs, said CCD detector and said conversion means.

2. A device as in claim 1 wherein said plurality of LEDs is disposed in a generally "V"-shaped arrangement.

3. A device as in claim 1 wherein said fan of light is projected to form a field of view within which said optical code can be read.

4. A device as in claim 3 wherein said field of view is within the range of zero to 9 inches.

5. A device as in claim 1 wherein said optic module comprises a plurality of lenses disposed within a dark room for shielding out external light.

6. A device as in claim 1 *further comprising a window disposed at said front of said circuit board* wherein said plurality of LEDs is disposed as close as possible to said window.

7. A device as in claim 1 wherein said plurality of LEDs comprises six LEDs with three LEDs disposed on each of said left side and said right side of said printed circuit board.

8. A device as in claim 5 wherein said plurality of lenses comprises at least two piano-convex lenses and one bi-convex lens disposed along a common optical path.

9. A device as in claim 8 wherein said optic module further comprises at least one optical filter disposed along said common optical path.

*10. In a device for scanning and decoding information encoded in an optical code, said device comprising a housing having a window portion with a first width, said housing retaining therein at least one printed circuit board having a front corresponding to said window portion, a light source, an optic module for focusing reflected light which is reflected from the optical code at a focal plane, and a CCD detector disposed substantially at said focal plane for receiving said reflected light and generating an electrical signal in response thereto, each mounted within said housing, a conversion means for converting said electrical signal into a digital signal corresponding to said optical code and a voltage source for providing a driving voltage to said light source, said CCD detector and said conversion means, wherein said device has a field of view having a second width greater than the first width, an improved light source comprising:*

*a plurality of LEDs disposed near said front of said at least one printed circuit board, each LED of said plurality being directed to emit light in a direction different from other LEDs of said plurality, said plurality of LEDs creating an incident beam of light which increases in width as a distance from said window portion increases.*

*11. The improved light source for a device claimed in claim 10 wherein said each LED emits light having a wavelength of 660 nm.*

*12. In a device for scanning and decoding information encoded in an optical code at a variable distance from the device, the device comprising a housing having a housing head with a window portion, a center portion and a rear portion, and a longitudinal centerline bisecting said housing head into a left side and a right side, said housing head retaining at least one printed circuit board having a front portion adjacent said window portion, an optic module for focusing reflected light which is reflected from said optical code at a focal plane disposed in said center portion of said housing head and a CCD detector disposed on said at least one printed circuit board substantially at said focal plane, for receiving said reflected light and generating an electrical signal in response thereto, a conversion means for converting said electrical signal into a digital signal corresponding to said optical code, and a voltage source for providing a driving voltage to said plurality of LEDs, said CCD detector and said conversion means, the improvement comprising:*

*a plurality of LEDs disposed near said front portion of said at least one printed circuit board, a first portion of said plurality of LEDs being disposed in said left side of said housing head and a second portion of said plurality of LEDs being disposed in said right side of said housing head, each of said first portion and said second portion of said plurality of LEDs being directed to project light outward from said front through said window portion so that a fan of light is emitted which becomes increasingly broad at greater distances beyond said window portion.*

*13. The device claimed in claim 12 wherein said each LED emits light having a wavelength of 660 nm.*

*14. A device for scanning and decoding information encoded in an optical code having a first width, said device comprising:*

*at least one printed circuit board having a front, a center, a rear and a longitudinal centerline bisecting said at least one printed circuit board into a left side and a right side, said front having a second width smaller than said first width;*

*a plurality of LEDs disposed on said at least one printed circuit board near said front for projecting a light outward from said front, a first portion of said plurality of LEDs being disposed on said left side and a second portion of said plurality of LEDs being disposed on said right side, each LED of said first portion and said second portion of LEDs being directed to emit light at a non-zero angle with respect to said centerline so that a fan of light is emitted which has a beam width which increases at greater distances from said front of said at least one printed circuit board;*

*an optic module disposed at said center of said at least one printed circuit board for focusing reflected light which is reflected from the optical code at a focal plane;*

*a CCD detector disposed substantially at said focal plane on said at least one printed circuit board for receiving said reflected light and generating an electrical signal in response thereto;*

*a conversion means for converting said electrical signal into a digital signal corresponding to said optical code; and*

*a voltage source for providing a driving voltage to said plurality of LEDs, said CCD detector and said conversion means.*

*15. The device claimed in claim 14 wherein said each LED emits light having a wavelength of 660 nm.*

*16. The device claimed in claim 14 further comprising a light-transmissive window disposed adjacent said front of said at least one printed circuit board in front of said plurality of LEDs.*

*17. A device for scanning and decoding information encoded in an optical code having a first width, said device comprising:*

*a housing having a second width at a front end at which an incident beam of light for illuminating said optical code exits said housing, said second width being smaller than said first width;*

*at least one printed circuit board retained within said housing and having a front corresponding to said front end of said housing, a center, a rear and a longitudinal centerline bisecting said printed circuit board into a left side and a right side;*

*a plurality of LEDs disposed near said front of said at least one printed circuit board for projecting light outward from said front, a first portion of said plurality of LEDs being disposed on said left side and a second portion of said plurality of LEDs being disposed on said right side, each LED of said first portion of LEDs and said second portion of LEDs being directed to emit light at a non-zero angle with respect to said centerline so that said plurality of LEDs emits a diverging incident beam of light beyond said front end of said housing;*

*an optic module disposed at said center of said housing for focusing reflected light which is reflected from the optical code at a focal plane;*

*a CCD detector disposed substantially at said focal plane on said at least one printed circuit board for receiving said reflected light and generating an electrical signal in response thereto;*

*a conversion means for converting said electrical signal into a digital signal corresponding to said optical code; and*

*a voltage source for providing voltage to said plurality of LEDs, said CCD detector and said conversion means;*

*wherein said device is held at a distance from said bar code symbol and said diverging incident beam of light has a width at least as wide as said first width at a point at which said diverging incident beam of light contacts said optical code.*

*18. The device claimed in claim 17 wherein said each LED emits light having a wavelength of 660 nm.*

*19. The device claimed in claim 17 further comprising a light-transmissive window retained within said front end of said housing in front of said plurality of LEDs.*

*20. The device claimed in claim 17 further comprising an indicator lamp disposed on said housing for providing visual indication of a successful decode by said optical scanner.*

*21. The device claimed in claim 17 further comprising a dark room disposed on said at least one printed circuit board so that said dark room surrounds said optic module and said CCD detector.*

*22. The device claimed in claim 12 further comprising a dark room disposed on said at least one printed circuit board, said dark room surrounding said optic module and said CCD detector.*

* * * * *